United States Patent [19]
Ohtani et al.

[11] Patent Number: 5,965,904
[45] Date of Patent: Oct. 12, 1999

[54] SEMICONDUCTOR DEVICE COMPRISING SILICON SEMICONDUCTOR LAYER

[75] Inventors: Hisashi Ohtani; Akiharu Miyanaga; Yasuhiko Takemura, all of Kanagawa, Japan

[73] Assignee: Semiconductor Energy Laboratory Co., Ltd., Kanagawa, Japan

[21] Appl. No.: 08/956,769

[22] Filed: Oct. 22, 1997

Related U.S. Application Data

[63] Continuation of application No. 08/703,400, Aug. 26, 1996, abandoned, which is a continuation of application No. 08/358,019, Dec. 16, 1994, abandoned.

[30] Foreign Application Priority Data

Dec. 17, 1993 [JP] Japan .................................. 5-343951

[51] Int. Cl.$^6$ .................................................. H01L 29/04
[52] U.S. Cl. ................................. 257/57; 257/64; 257/66; 257/255

[58] Field of Search ................................. 257/64, 66, 255, 257/627, 628

[56] References Cited

U.S. PATENT DOCUMENTS

| | | | |
|---|---|---|---|
| 4,835,059 | 5/1989 | Kodato | 257/347 |
| 4,905,072 | 2/1990 | Komatsu et al. | 257/66 |
| 5,132,754 | 7/1992 | Serikawa et al. | 257/57 |

*Primary Examiner*—David B. Hardy
*Attorney, Agent, or Firm*—Sixbey, Friedman, Leedom & Ferguson, P.C.; Gerald J. Ferguson, Jr.; Jeffrey L. Costellia

[57] ABSTRACT

The principle portion of a semiconductor device is made from a polycrystalline silicon semiconductor layer which yields an X ray diffraction pattern or an electron beam pattern with the (311) diffraction peak intensity accounting for 15% or more of the total diffraction peak intensity. A semiconductor device improved in performance and reliability can be obtained by reducing the density of states at the boundary between the polycrystalline silicon film and the gate insulating film.

23 Claims, 6 Drawing Sheets

SEMICONDUCTOR DEVICE COMPRISING SILICON SEMICONDUCTOR LAYER

This application is a Continuation of Ser. No. 08/703,400, filed Aug. 26, 1996, now abandoned; which itself is a continuation of Ser. No. 08/358,019, filed Dec. 16, 1994, abandoned.

BACKGROUND OF THE INVENTION

The present invention relates to a semiconductor device such as a field effect thin film transistor, and more particularly, it relates to a semiconductor device comprising a highly reliable and stable semiconductor layer with excellent operation characteristics, i.e., a layer of polycrystalline silicon thin film semiconductor, as the principal portion thereof.

With increasing size of scanning circuit portions of image scanners such as long-arrayed optical sensors and large-area two dimensional optical sensors for image reading, or of driver circuits of image display devices based on, for example, liquid crystal materials (referred to simply hereinafter as "LCs"), electrochromic materials (referred to simply hereinafter as "ECs"), or electroluminescent materials (referred to simply hereinafter as "ELs"), it is proposed to use the thin films of silicon deposited on a predetermined substrate as the base material for the circuits.

Thin films of silicon is a well known material, and they have been widely used in faster and in more functional large image readers and image display devices. To this end, polycrystalline silicon (polysilicon) films are preferred to amorphous ones. More specifically, polysilicon thin films yield far higher effective carrier mobility $\mu_{eff}$ as compared to amorphous silicon thin films obtained by an ordinary process of discharge decomposition which yields an $\mu_{eff}$ as low as 0.1 cm$^2$/V·sec. Higher effective carrier mobility $\mu_{eff}$ is essential for a material constituting the scanning circuits of a high speed and high performance image readers and or for a material constituting the driver circuits of high quality image display devices, and, moreover, the amorphous silicon thin films above suffers a severe deterioration with the passage of time. For example, the amorphous silicon thin film obtained by ordinary discharge decomposition suffers a decrease in drain current and a drift of the transistor threshold voltage with increasing duration of applied DC voltage to the gate. In contrast to the disadvantages of the amorphous silicon thin film, a polysilicon thin film yields a far higher effective carrier mobility $\mu_{eff}$, and, theoretically, there is still a possibility of fabricating a thin film having a yet higher mobility $\mu_{eff}$.

In practice, however, the devices based on the polycrystalline silicon thin films fabricated according to various processes obtained upto the present are still unsatisfactory in performance and reliability.

In the light of such circumstances, the present inventors have found that, in a semiconductor device based on polycrystalline silicon thin film, the performance and the reliability of the device depend on the crystallographic orientation of the silicon thin film.

SUMMARY OF THE INVENTION

An object of the present invention is to provide a semiconductor device comprising a high performance semiconductor layer of polycrystalline silicon.

Another object of the present invention is to provide a high performance field effect thin film transistor with high reliability and stability, using a polycrystalline silicon thin film semiconductor formed on a substrate.

A still other object of the present invention is to provide a large area semiconductor device comprising the field effect thin film transistor made from high quality polycrystalline silicon thin film semiconductor layer as the constituent elements.

The semiconductor device according to the present invention is characterized in that the principal portion thereof is fabricated from a polycrystalline silicon semiconductor film strongly oriented in the crystallographic (311) plane as compared with a film in which the crystals are arranged in a completely random crystallographic orientation (non-oriented).

A field effect thin film transistor fabricated according as one example of semiconductor devices using a polycrystalline silicon semiconductor film strongly oriented in the crystallographic (311) plane yields excellent transistor characteristics (such as effective carrier mobility, threshold voltage $V_{th}$, ON/OFF ratio, and gm). It is also free from deterioration in transistor characteristics due to continuous operation, and yet, products with uniform quality can be obtained with high production yield. Accordingly, the devices thus obtained are suitable for fabricating scanning or driver circuits of display or image devices using, for example, LC, EL, or EC.

The semiconductor devices fabricated from the polycrystalline silicon thin film according to the present invention include a field effect thin film transistor (an insulated gate field effect transistor). A field effect thin film transistor is a transistor comprising a semiconductor layer, an electrode layer, and an insulating layer. More specifically, the transistor is operated by applying a voltage to the source electrode and the drain electrode having ohmic contacts adjacent to the semiconductor layer, and the channel current obtained as a result is applied to the gate electrode with an insulating layer incorporated therebetween to provide a bias voltage.

Referring to FIG. 1, a basic structure of a thin film transistor (referred to sometimes hereinafter simply as a "TFT") of this type is described. It should be noted that FIG. 1 does not illustrate the novel polycrystalline silicon thin film according to the present invention, but instead is merely provided to illustrate the basic structure of a TFT in which the polycrystalline silicon thin film of the present invention can be utilized. A source electrode 103 and a drain electrode 104 are formed in contact with a semiconductor layer 102 provided on an insulating substrate 101, and an insulating layer 105 is formed thereon to cover the entire structure with a gate electrode 106 formed further thereon.

In a TFT according to the present invention with reference to FIG. 1, the semiconductor layer 102 may be fabricated from a thin film of polycrystalline silicon as described hereinbefore, and a first n$^+$ layer 107 and a second n$^+$ layer 108 made from amorphous silicon are provided between the semiconductor layer 102 and the two electrodes, i.e., between the semiconductor layer 102 and the source electrode 103 and between the semiconductor layer 102 and the drain electrode 104 to provide each an ohmic contact.

The insulating layer 105 is fabricated by CVD (chemical vapor deposition), LPCVD (low pressure CVD), PCVD (plasma-assisted CVD), etc., using materials such as silicon nitride, SiO$_2$, Al$_2$O$_3$, etc.

Field effect thin film transistors can be classified into two types; i.e., a type having a gate insulating layer on the gate electrode (lower gate type), and a type having the gate electrode on a gate insulating layer (upper gate type).

According to another classification, they can be classified into coplanar type TFTs having the source electrode and the drain electrode in the boundary between the insulating layer and the semiconductor layer, and stagger type TFTs having the source electrode and the drain electrode on the semiconductor plane opposed to the boundary between the insulating layer and the semiconductor layer. Thus, by combining the former two types with the latter two types, there are four types of field effect TFTs. Although a coplanar field effect thin film is referred in FIG. 1, as a matter of course, the field effect TFT according to the present invention can be of any type of the aforementioned four types.

According to the present invention, the polycrystalline silicon thin film which constitutes the semiconductor layer, i.e., the principal portion of a semiconductor device, is observed by means of X ray diffraction or electron beam diffraction to obtain the degree of orientation for the crystallographic (311) plane thereof. It has been found that various transistor characteristics of a device can be improved when any of the following conditions is satisfied:
(1) the diffraction peak intensity attributed to the (311) plane of the semiconductor layer accounts for 15% or more of the entire diffraction intensity;
(2) the diffraction peak intensity attributed to the (311) plane of the semiconductor layer accounts for 40% or more of the (111) diffraction peak intensity;
(3) the diffraction peak intensity attributed to the (311) plane of the semiconductor layer accounts for 80% or more of the (220) diffraction peak intensity; or
(4) the diffraction peak intensity attributed to the (311) plane of the semiconductor layer accounts for 25% or more of the total intensity of (111) and (220) diffraction peaks. These conditions all signify an increase in the area of (311) planes having a lower density of states for the gate insulating film which is provided in contact with the polycrystalline silicon film.

The polysilicon thin film transistor according to the present invention suffers less deterioration in transistor characteristics with the passage of time. The deterioration of the polysilicon thin film transistor was evaluated in the following manner.

Referring to the schematically drawn structure in FIG. 2, a TFT was fabricated, and a gate voltage $V_G$ of 40 V and a drain voltage $V_D$ of 40 V were applied to the gate 201 and between the source 203 and drain 202, respectively. The drain current $I_D$ between the source and the drain was measured using an electrometer (Keithley 610C Electrometer) to observe the change of drain current with the passage of time. The rate of change with time was obtained by dividing the change in drain current after continuous operation for a duration of 500 hours with the initial drain current. The value is multiplied 100 times to express it in percentage.

The threshold voltage $V_{TH}$ of the TFT was defined in the same manner as in case of MOSFETs. More specifically, the linear portion in the $V_D$-$I_D$ curve was extrapolated, and the crossing with the $V_{TH}$ axis was taken as the threshold voltage. The change in threshold voltage was also evaluated by measuring both $V_{TH}$ values before and after passage of time, and was expressed in Volts.

The crystallinity and the crystallographic orientation of the polysilicon thin film differ depending on the process and the condition of film fabrication.

The X ray diffraction intensity of the various types of polysilicon thin films obtained under differing conditions was measured using a Rigaku X ray diffractometer (manufactured by Rigaku Denki Co., Ltd.) using copper X-ray tube at 35 KV-100 mA. The scanning angle range was set from 20° to 65° to obtain the diffraction peaks assigned to (111), (220), and (311) crystallographic planes.

The intensity of electron beam diffraction was obtained using JFM-100V (an electron beam microscope manufactured by JEOL Ltd. According to the PDF-ASTM card (No. 27-1977), for a non-oriented polycrystalline silicon, the three principal crystallographic planes expressed by Miller indices (hkl), i.e., (111), (220), and (311), yield an intensity ratio of 100:50:30. Thus, the intensity for the (311) plane as expressed by ratio with respect to the total for all the diffraction peak intensities can be calculated by [the diffraction peak intensity for (311)]/[total intensity for all diffraction peaks], and is about 12% [=(30/250)×100 (%)].

Thus, based on this value as a standard, a polysilicon thin film having a high (311) crystallographic orientation of 15% or higher yields favorable transistor characteristics. If this value is less than 15%, the deterioration of the device becomes unfavorably severer with the passage of time.

The ratio of the (311) peak intensity with respect to the intensities of the peaks attributed to other planes is also important. If other planes having higher density of levels yield intense peaks, the effect according to the present invention may be lost. Because the (111) plane and the (110) plane (detected as an intensity attributed to (220) plane) have higher density of levels, the relative intensity of those planes with respect to the (311) plane is preferably as low as possible.

In case of random-oriented polycrystalline silicon, the ratios of the diffraction intensity for the (311) plane with respect to the intensities for the peaks assigned to (111) and the (220) planes are 30% and 55%, respectively. It has been found, however, that favorable characteristics can be obtained when a diffraction intensity ratio of 40% or higher and 80% or higher, respectively, are achieved.

The ratio of the diffraction intensity attributed to the (311) plane with respect to that in total for the (111) and (220) diffraction planes is 19% in the non-oriented polycrystalline silicon film. Again, it has been found that favorable device characteristics are obtained on a film having (311) diffraction peak intensity accounting for a percentage as high as 25% or more.

As shown in detail in the Examples hereinafter, the preferred polysilicon thin film suitable for the object of the present invention can be formed particularly by glow discharge decomposition process (referred to simply as "GD process") of silicon hydrides such as $SiH_4$, $Si_2H_6$, and $Si_3H_8$, sputtering of silicon in a chlorine radical atmosphere (referred to simply as "SP process"), or ion plating at a substrate temperature of 500° C. or lower (preferably in a range of from about 400 to 500° C.).

The use of the aforementioned process is not only advantageous from the viewpoint of fabricating large area driver circuits or scanning circuits of large area devices using low cost substrate materials and by uniformly heating the substrate, but also from the point of view of allowing use of light-transmitting glass substrates in fabricating image device applications such as transmission type display devices and photoelectric conversion photoreceptor devices in which the light is incident from the substrate side.

An amorphous film once deposited by carrying out one of the processes above at room temperature or while heating properly can be crystallized by irradiating thereto a laser light or an intense light equivalent to the laser light. In this manner, a polycrystalline silicon film suitable for accomplishing the object of the present invention can be also obtained. Thus, the present invention can be conducted at lower temperatures as compared with the conventional ones. Accordingly, the present invention allows use of a general use low melting point glass, heat resistance plastics, and the like in addition to the conventionally used materials such as heat resistant glasses (e.g., refractory glass and hard glass), heat resistance ceramics (e.g., sapphire glass and spinel), and silicon wafers.

The glass substrate for use in the present invention include an average glass having a softening point of 630° C., a normal hard glass having a softening point of 780° C., and a super hard glass having a softening point of 820° C. (JIS first class super hard glass).

The process according to the present invention is conducted at a temperature lower than the softening point of any of the aforementioned substrates. Accordingly, the polysilicon film can be deposited advantageously without causing damage on the substrate.

In the following examples according to the present invention, a Corning 7059 glass was selected principally as an average glass having a low softening point. However, also usable is a quartz glass having a softening point of 1,500° C. From the practical viewpoint, however, the use of an inexpensive average glass is advantageous in fabricating large-area thin film transistors.

DETAILED DESCRIPTION OF THE PREFERRED EMBODIMENTS

The present invention is described in further detail referring to the following Examples. The process for fabricating TFTs from the deposition of a thin film polycrystalline silicon, and the operation of the thus fabricated TFTs are described in detail. It should be understood, however, that the present invention is not to be construed as being limited to the examples below.

EXAMPLE 1

Figure 1:
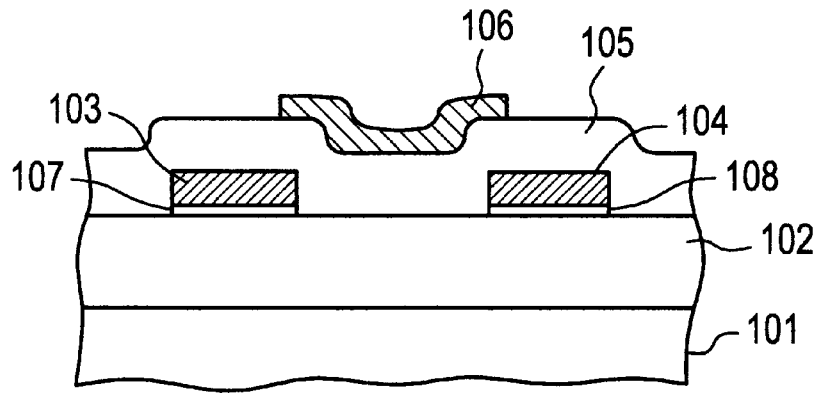
FIG. 1 is a schematically drawn structure of a semiconductor device according to the present invention provided as an explanatory means.
Figure 2:
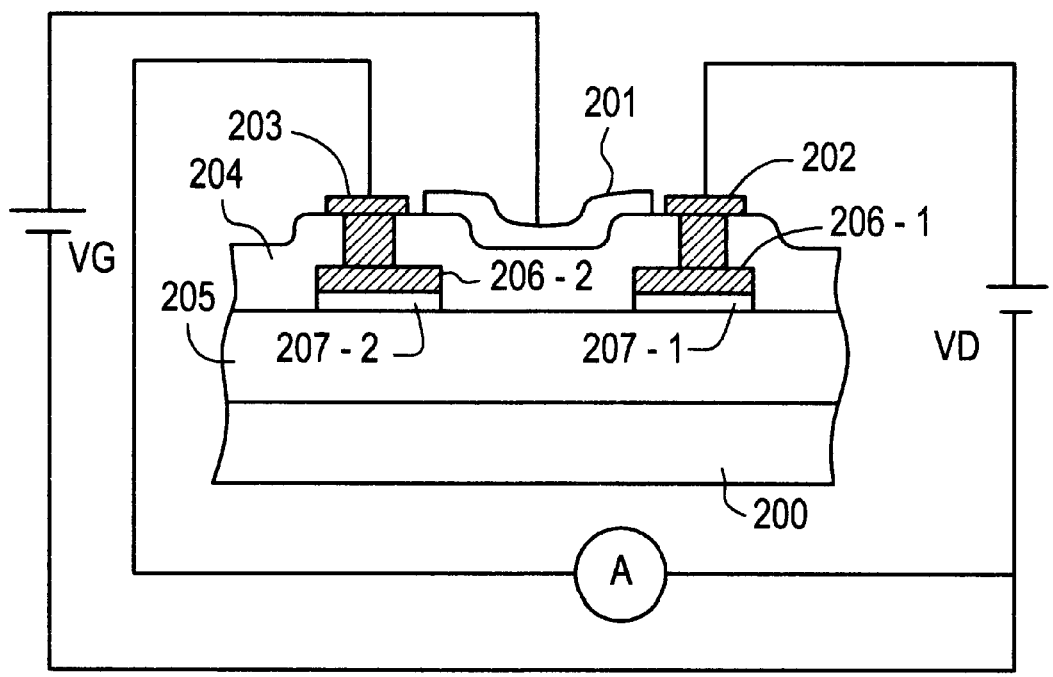
FIG. 2 is a schematically drawn circuit for measuring the characteristics of a semiconductor device according to the present invention provided as an explanatory means.
Figure 3:
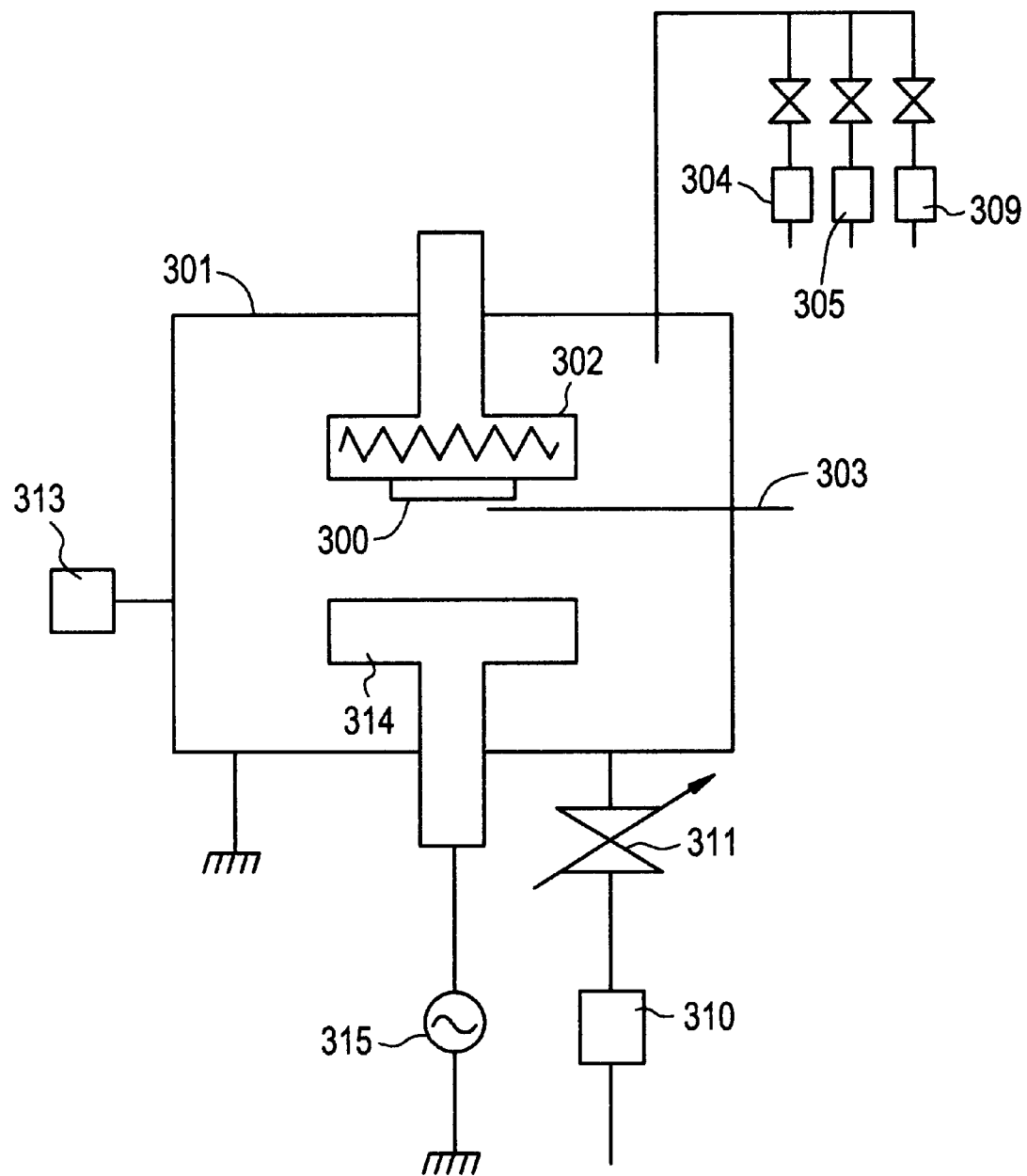
FIG. 3 is a schematically drawn apparatus for fabricating a semiconductor film according to an embodiment of the present invention provided as an explanatory means.

A TFT was fabricated by depositing a polycrystalline silicon thin film on a substrate using an apparatus illustrated in FIG. 3.

A Corning #7059 glass substrate 300 was washed by lightly etching the surface of the substrate using a mixed acid solution of hydrofluoric acid, nitric acid, and acetic acid. After drying, the resulting substrate was attached to a substrate heating holder 302 placed on the anode side of a bell jar (vacuum deposition chamber) 301.

The inside of the bell jar 301 was evacuated using a diffusion pump 310 until a vacuum of $2\times10^{-6}$ Torr was achieved as the background degree of vacuum. If a sufficiently high degree of vacuum is not obtained at this point, the reactive gas to be introduced hereinafter would not deposit effectively. Moreover, oxygen and nitrogen would be incorporated into the deposited film to greatly influence the resistance of the resulting thin film polysilicon. Then, the substrate temperature $T_S$ is raised to 500° C. to keep the substrate 300 at the temperature. The substrate temperature is monitored using a thermocouple 303.

A mixed gas of $SiH_4$ and $H_2$ was used as the reactive gas in the present example. The flow rate of gaseous $SiH_4$ and $H_2$ was controlled with mass flow controllers 304 and 305, respectively, to maintain the gases to be supplied at a rate of 2 sccm and 10 sccm, respectively.

The inner pressure of the bell jar 301 was set at 0.3 Torr by controlling the pressure control valve 311 placed on the evacuation side of the bell jar 301 and using an absolute pressure meter 313.

After a stable pressure was achieved inside the bell jar 301, glow discharge was initiated by applying a high frequency electric field of 13.56 MHz to a cathode 314 using a power supply 315. The high frequency field thus applied was at a voltage of 0.5 kV, a current of 48 mA, and an RF discharge power of 100 W. Thus was obtained a uniform thin film at a thickness of 5,000 Å, with a fluctuation in thickness falling within ±10% over the entire substrate 120×120 mm in area.

The crystallographic orientation of the thus deposited thin film was evaluated using X ray diffraction. The evaluation is made by comparing the peak intensity of the selected diffraction, and is expressed in terms of 30% (=I(311)/I(total)×100), where I(311) represents the intensity of the (311) diffraction peak and I(total) represents the total intensity of the other diffraction peaks. The film thus obtained was found to consist of crystals 800 Å in average diameter.

A TFT was fabricated according to a process shown schematically in FIG. 4 using the thus deposited film. In step with reference to FIG. 4(A), a polysilicon film 401 is deposited on a glass substrate 300 according to the process described above. It should be noted that FIGS. 4(A)–(G) do not illustrate the novel polycrystalline silicon thin film according to the present invention, but instead are merely provided to illustrate a method of forming a TFT structure in which the polycrystalline silicon thin film of the present invention can be formed. Then, a phosphorus (P) doped n$^+$ layer 402 was deposited to a thickness of 500 Å by glow discharge in the bell jar 301 under a controlled inner pressure of 0.12 Torr while flowing $PH_3$ gas diluted to 100 ppm by volume using hydrogen gas (referred to simply hereinafter as $PH_3$(100 ppm) /$H_2$) and $SiH_4$ gas diluted to 10% by volume using hydrogen gas (referred to simply hereinafter as $SiH_4$(10%) /$H_2$) at a ratio by molar of the former to the latter of $5\times10^{-3}$ (FIG. 4(B)).

Figure 4A:
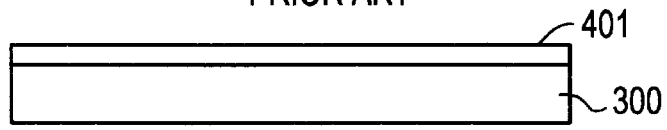
FIGS. 4(A) to 4(G) show a schematically drawn diagram showing the step sequential structures in the process for fabricating a semiconductor device according to an embodiment of the present invention.
Figure 4B:
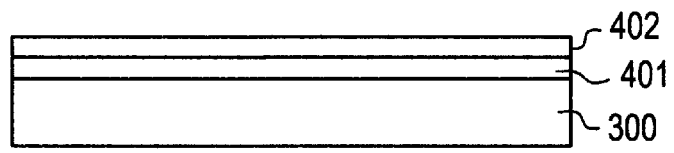
Figure 4C:
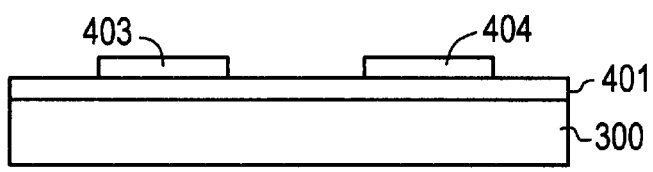
Figure 4D:
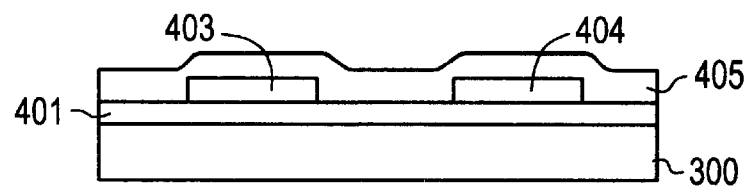
Figure 4E:
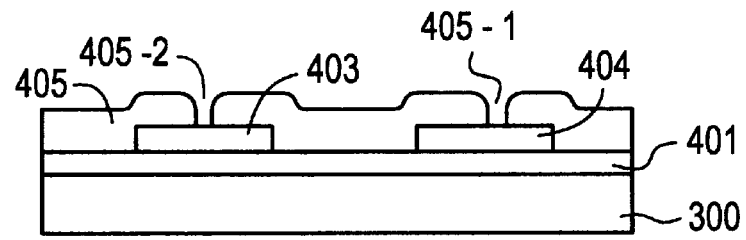
Figure 4F:
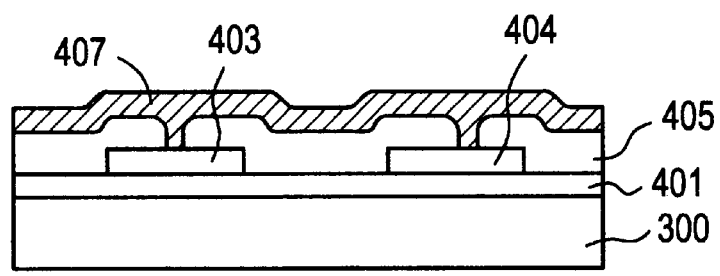
Figure 4G:
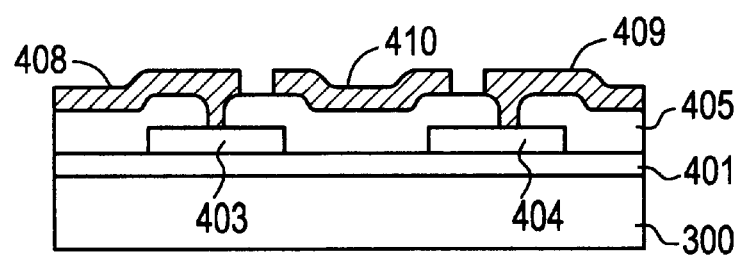

With reference to FIG. 4(C), the n$^+$ layer 402 was removed by photoetching except for source electrode region 403 and drain electrode region 404. The above substrate was set inside the bell jar 301 again on the heating holder 302 on the anode side to form thereon a gate insulating film. In the same manner as in the step for fabricating polysilicon, the inside of the bell jar 301 was evacuated, and an SiNH film 405 was deposited to a thickness of 2,500 Å by introducing $NH_3$ gas and $SiH_4$ (10%)/$H_2$ gas at a rate of 20 sccm and 5 sccm, respectively, while maintaining the substrate temperature $T_S$ at 250° C.

Contact holes 405-1 and 405-2 were perforated by photoetching for the source electrode 403 and the drain electrode 404. After vapor depositing aluminum on the entire surface of the SiNH film 405 to form an electrode film 407, the aluminum layer was photoetched to form a lead electrode 408 for the source electrode, a lead electrode 409 for the drain electrode, and a gate electrode 410. The resulting structure was heated at 250° C. in $H_2$ atmosphere to obtain a stable and high performance thin film transistor having a channel length L of 10 μm and a channel width W of 500 μm.

Figure 5:
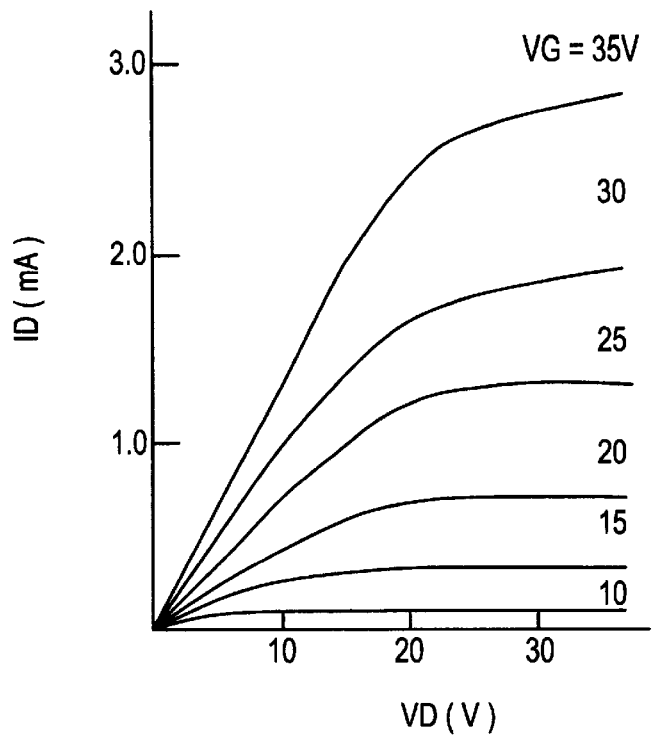
FIG. 5 is a graph showing the $V_D$-$I_D$ characteristics of a semiconductor device according to the present invention.

The TFT thus fabricated was evaluated. The $V_D$-$I_D$ characteristic curve is shown in FIG. 5. Referring to FIG. 5, $V_D$ represents the drain voltage, $V_G$ represents the gate voltage, and $I_D$ represents the drain current. An $I_D$ of $7.2 \times 10^{-4}$ A is obtained at a $V_G$ of 20 V, and an ID of $1.0 \times 10^{-8}$ A is obtained at a $V_G$ of 0 V. The threshold voltage was found to be 4.0 V. Generally, above figures are obtained from linear portion of $V_G$-$I_D$ curve in MOS-TFT device. The effective mobility $\mu_{eff}$ as obtained from the linear portion of the $V_G$-$I_D$ curve in the same manner as in case of an ordinary MOS-TFT device was 96 cm$^2$/V·sec, a favorable value for a TFT. The stability of the device was evaluated by continuously measuring $I_D$ while applying DC voltage to the gate at a $V_G$ of 40 V for a duration of 500 hours. Little fluctuation falling within a range of ±0.1% was observed for the $I_D$. No change in the threshold value ($\Delta V_{TH}$) was observed before and after initiating the measurement. Accordingly, excellent stability was observed for the TFT. The $V_D$-$I_D$ characteristic curve and the $V_G$-$I_D$ curve obtained after the measurement showed no change as compared with those before initiating the measurement. The mobility $\mu_{eff}$ also yielded an unchanged value of 89 cm$^2$/V·sec after the measurement.

As described in the present example, a high performance TFT can be obtained by constructing the principal portion thereof with a polycrystalline silicon thin film containing chlorine at a concentration of 1% by atomic, having an orientation degree of 30%, and consisting of crystals 800 Å in average diameter.

EXAMPLE 2

Polycrystalline silicon films each 0.5 μm in thickness were deposited on a Vycor glass substrate in the same manner as the process described in Example 1, under an RF power (Po) of 150 W, a flow rate of SiH$_4$ and H$_2$ of 2 sccm and 10 sccm respectively, and under a glow discharge pressure (Pr) of 0.3 Torr. The substrate temperature ($T_S$) was varied every 50° C. from 350° C. to 700° C. The degree of orientation obtained in the same manner as described in Example 1 for each of the thin films thus fabricated and the effective mobility $\mu_{eff}$ for the TFTs fabricated from each of the thin films are shown in Table 1.

Table 1 clearly shows that samples having a degree of orientation of lower than 15% yield an effective mobility of 10 cm$^2$/V·sec or lower, and that they are practically unfeasible.

TABLE 1

| Sample Nos. | $T_s$ (° C.) | Orientation* (%) | $\mu_{eff}$ (cm$^2$/V · sec) |
|---|---|---|---|
| 1-1 | 350 | 13 | 3.8 |
| 1-2 | 400 | 12 | 5.2 |
| 1-3 | 450 | 16 | 12.4 |

TABLE 1-continued

| Sample Nos. | $T_s$ (° C.) | Orientation* (%) | $\mu_{eff}$ (cm$^2$/V · sec) |
|---|---|---|---|
| 1-4 | 500 | 20 | 24.5 |
| 1-5 | 550 | 18 | 24.8 |
| 1-6 | 600 | 23 | 19.2 |
| 1-7 | 650 | 21 | 21.6 |
| 1-8 | 700 | 25 | 20.7 |

*Orientation signifies the intensity ratio of (311) diffraction peak to the total intensity of the other diffraction peaks.

EXAMPLE 3

A Corning # 7059 glass substrate 300 prepared in a manner similar to that in Example 1 was tightly fixed on a substrate heating holder 302 placed on the upper anode side inside a bell jar 301, and the polysilicon plate (purity: 99.99% not shown in the figure) was allowed to stand still on the electrode plate of the lower cathode 314 in such a manner that it may be opposed to the substrate. After evacuating the bell jar 301 using a diffusion pump 310 to a vacuum degree of $2 \times 10^{-6}$ Torr, the substrate heating holder 302 was heated to maintain the surface temperature of the substrate 300 to 450° C.

Then, gaseous SiH$_4$ was introduced inside the bell jar while controlling its flow rate to 25 sccm using a mass flow meter 304. Furthermore, gaseous argon was also introduced inside the bell jar 301 while controlling the rate thereof to 25 sccm using a mass flow meter 309. The inner pressure inside the bell jar was set to 0.005 Torr using a main valve 311.

After the inner pressure inside the bell jar was found to stabilize, glow discharge with a power of 300 W was generated between the crystalline silicon plate on a cathode 314 and an anode (substrate heating holder) 302 by applying a power of 26 KV to the lower cathode 314 using a high frequency power source 315 of 13.56 MHz. In this manner, a film about 0.5 μm in thickness was formed on the crystalline silicon plate.

The polycrystalline silicon film thus obtained was subjected to X ray diffraction analysis to find distinguished peaks assigned to (111), (220), and (311) diffraction. The peak intensity for (220) and (311) diffractions with respect to the (111) peak intensity taken as 100 was found to be 21 and 25, respectively. In other words, the intensity of the (311) diffraction peak was found to be 25% of that of the (111) diffraction peak, and was 119% of that of the (220) diffraction peak. Hence, the intensity of the (311) diffraction peak accounts for 21% of the total intensity for the (111) and (220) diffraction peaks.

A part of the thus obtained film was used in the fabrication of a TFT using the same process as that used in Example 1. The effective mobility $\mu_{eff}$ of the device thus obtained was found to be 65 cm$^2$/V·sec, and the change in $I_D$ and $V_{TH}$ while maintaining $V_G$ and $V_D$ at 15 V was measured, and the change in $I_D$ was found to be 0.1%. $V_{TH}$ was stable, and no change thereof was observed.

EXAMPLE 4

Figure 6:
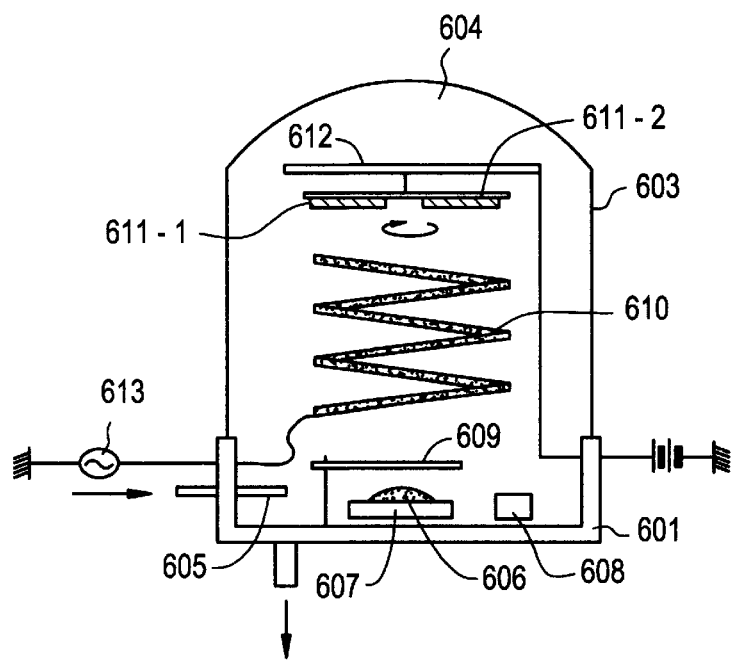
FIG. 6 is a schematically drawn apparatus for fabricating a semiconductor film according to another embodiment of the present invention provided as an explanatory means.

A thin film transistor was fabricated according to the present invention using a polysilicon thin film fabricated by ion plating as the semiconductor layer. The polysilicon thin film was deposited using an ion plating apparatus as shown in FIG. 6.

A silicon vapor source 606 of non-doped polysilicon was placed on a boat 607 inside an evacuatable deposition bell jar 603, and after setting Corning # 7059 glass substrates on supports 611-1 and 611-2 and evacuating the inside of the deposition chamber to a base pressure of about 1×10$^{-7}$ Torr, gaseous SiH$_4$ was introduced inside the deposition chamber through a gas inlet pipe 605 until a pressure of 4×10$^{-7}$ Torr was achieved. The gas inlet pipe thus used has an inner diameter of 2 mm, and comprises gas outlets 0.5 mm in diameter arranged at an interval of 2 cm on the front loop provided to the pipe.

Then, a high frequency plasma atmosphere was generated inside a high frequency coil 610 having a diameter of 5 mm by applying a high frequency of 13.56 MHz thereto to adjust the output thereof to 100 W.

At the same time, the heating apparatus 612 was operated while rotating the supports 611-1 and 611-2 to maintain the temperature thereof to about 450° C. Electron beam was irradiated to the evaporation source 606 using an electron gun 608. In this manner, the evaporation source 606 was heated to allow the silicon particles fly. A 0.5 μm thick polysilicon thin film was thus deposited by operating the electron gun at a power of about 0.5 kW. The resulting thin film was thus subjected to a process similar to that used in the previous example to fabricate a thin film transistor. The X ray diffraction peak intensity ratio of the (111), (311) and (220) diffraction peaks for the films according to the present example, expressed in relative values with respect to the intensity of the (111) diffraction peak taken as 100, are given in Table 2 together with the effective carrier mobility $\mu_{eff}$ of the thin film transistors fabricated therefrom.

Table 2 shows clearly that practically inferior TFTs with an effective mobility of 10 cm$^2$/V·sec or lower result from films having a (311) to (111) diffraction peak intensity ratio lower than 40%.

TABLE 2

| Sample No. | 4-1 | 4-2 | 4-3 |
|---|---|---|---|
| SiH$_4$ partial pressure (Torr) | 0 | 4 × 10$^{-5}$ | 2 × 10$^{-6}$ |
| I(220)/I(111) | 28 | 35 | 51 |
| I(311)/I(111) | 12 | 26 | 43 |
| $\mu_{eff}$(cm$^2$/V · sec) | 3.5 | 8.2 | 56.7 |

EXAMPLE 5

An amorphous silicon film was deposited on a Corning # 7059 glass substrate in the same manner as in Example 1 under an RF power (Po) of 150 W and a glow discharge pressure (Pr) of 0.3 Torr while flowing gaseous SiH$_4$ and H$_2$ at a flow rate of 2 sccm and 10 sccm, respectively. Thus, the thin film was deposited at a thickness of 500 Å while maintaining the substrate temperature (T$_S$) to 250° C. Laser beam in pulses was irradiated for 2 to 20 shots to the film at a substrate temperature in the range of from 200 to 400° C. under vacuum or in air using a KrF excimer laser operated at a wavelength of 248 nm and a pulse width of 20 nsec. The preferred range of the energy density for the laser beam was from 300 to 500 mJ/cm$^2$. The amorphous silicon film was thus crystallized in this manner. A diffractogram of the film obtained by X ray diffraction is given in FIG. 7.

The orientation characteristics (i.e., the ratio of the (311) diffraction peak intensity to the (111) diffraction peak intensity) of the polycrystalline silicon films thus obtained was evaluated according to a method described in Example 1, and the effective mobility $\mu_{eff}$ for the TFTs fabricated using the thin film was measured. The results are shown in Table 3.

Table 3 shows clearly that practically unfeasible inferior TFTs with an effective mobility of 100 cm$^2$/V·sec or lower result from films having a (311) to (111) diffraction peak intensity ratio of lower than 40%.

TABLE 3

| Sample No. | I(311)/I(111) | $\mu_{eff}$ (cm$^2$/V · sec) |
|---|---|---|
| 5-1 | 12 | 21.3 |
| 5-2 | 26 | 28.5 |
| 5-3 | 22 | 56.7 |
| 5-4 | 61 | 127.2 |
| 5-5 | 46 | 138.4 |
| 5-6 | 53 | 154.9 |

As described in the foregoing, favorable TFTs can be obtained in case of using polycrystalline silicon films which yield an intense (311) diffraction peak. This is clearly attributed to the low boundary density of states between the crystallographic (311) plane and the gate insulating film.

Figure 7:
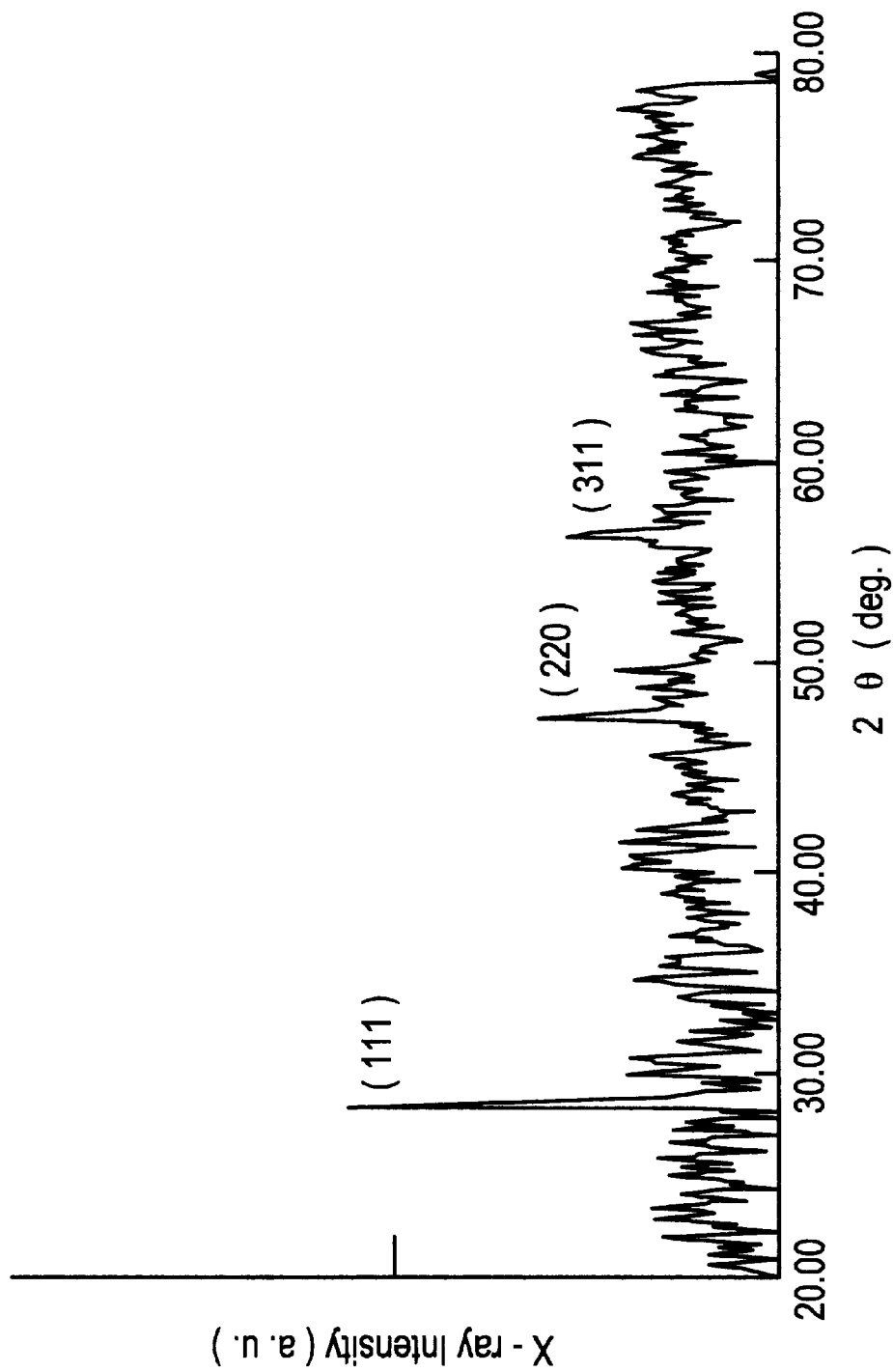
FIG. 7 is an X-ray diffractogram of a semiconductor film according to the present invention.

It should be noted, however, that the intensity ratio of the X ray diffraction peaks as obtained in FIG. 7 does not directly represent the existence ratio of the crystallographic planes. Because the diffraction intensity mainly depends on the structural factor and the atomic scattering factor, the actual existence ratio of the crystallographic planes can be obtained by dividing the intensity ratio with the diffraction factor.

For instance, the existence ratios for the (111), (110), and (311) planes in a randomly oriented sample are the same. However, the actual intensity ratio obtained for the (111), (220), and (311) planes is 100:55:30. This signifies that (311) plane causes diffraction for only 30% with respect to the diffraction from the (111) plane.

Referring to FIG. 7, the intensity ratio (111):(220):(311) plane is 100:53:46. It may seem that the (111) is predominant in the sample, however, considering the atomic scattering factor and the like, the existence ratio for the (111), (110), and (311) planes is actually 100:96:153. It can be clearly understood that the (311) plane is predominant.

In the device according to the present invention, the intensity of the (311) plane with respect to the other crystallographic planes as observed by X ray diffraction or electron beam diffraction need not be high. For example, an intensity of the (311) diffraction peak accounting for 40% or more of that of the (111) diffraction peak is sufficient. This does not signify that (311) planes are scarce. In fact, taking the diffraction factor of each of the planes into consideration, the actual presence ratio of the (311) planes with respect to the (111) planes is 1.2 or higher.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising a polycrystalline silicon semiconductor layer which yields a diffraction pattern with the (311) diffraction peak intensity accounting for 15% or more of the total intensity of all diffraction peaks.

2. The device of claim 1 wherein said semiconductor device comprises an insulated gate field effect transistor.

3. The device of claim 2 further comprising a gate insulating film provided in contact with said polycrystalline silicon semiconductor layer, said gate insulating film and said polycrystalline silicon semiconductor layer constituting said insulated gate field effect transistor.

4. The device of claim 1 wherein said polycrystalline silicon semiconductor layer is provided on an insulating substrate.

5. The device of claim 4 wherein said substrate comprises a glass, a plastic, a ceramic, or a silicon wafer.

6. The device of claim 1 wherein said polycrystalline silicon semiconductor layer is provided on a substrate comprising a material selected from the group consisting of a glass, a sapphire, a spinel, a silicon and a plastic.

7. The device of claim 1 wherein said semiconductor device constitutes a display using a liquid crystal material, an electroluminescent material, or an electrochromic material.

8. A semiconductor device comprising a polycrystalline silicon semiconductor layer which yields a diffraction pattern with the (311) diffraction peak intensity accounting for 40% or more of the (111) diffraction peak intensity.

9. The device of claim 8 wherein said semiconductor device comprises an insulated gate field effect transistor.

10. The device of claim 9 further comprising a gate insulating film provided in contact with said polycrystalline silicon semiconductor layer, said gate insulating film and said polycrystalline silicon semiconductor layer constituting said insulated gate field effect transistor.

11. The device of claim 8 wherein said polycrystalline silicon semiconductor layer is provided on an insulating substrate.

12. The device of claim 11 wherein said substrate comprises a glass, a plastic, a ceramic, or a silicon wafer.

13. The device of claim 8 wherein said polycrystalline silicon semiconductor layer is provided on a substrate comprising a material selected from the group consisting of a glass, a sapphire, a spinel, a silicon and a plastic.

14. The device of claim 8 wherein said semiconductor device constitutes a display using a liquid crystal material, an electroluminescent material, or an electrochromic material.

15. A semiconductor device comprising a polycrystalline silicon semiconductor layer which yields a diffraction pattern with the (311) diffraction peak intensity accounting for 25% or more of the total intensity of the (111) diffraction peak and the (220) diffraction peak.

16. The device of claim 15 wherein said semiconductor device comprises an insulated gate field effect transistor.

17. The device of claim 16 further comprising a gate insulating film provided in contact with said polycrystalline silicon semiconductor layer, said gate insulating film and said polycrystalline silicon semiconductor layer constituting said insulated gate field effect transistor.

18. The device of claim 15 wherein said polycrystalline silicon semiconductor layer is provided on an insulating substrate.

19. The device of claim 18 wherein said substrate comprises a glass, a plastic, a ceramic, or a silicon wafer.

20. The device of claim 15 wherein said polycrystalline silicon semiconductor layer is provided on a substrate comprising a material selected from the group consisting of a glass, a sapphire, a spinel, a silicon and a plastic.

21. The device of claim 15 wherein said semiconductor device constitutes a display using a liquid crystal material, an electroluminescent material, or an electrochromic material.

22. A semiconductor device comprising:

a silicon semiconductor layer which yields a diffraction pattern with the (311) diffraction peak intensity accounting for 15% or more of the total intensity of all diffraction peaks; and a gate insulating film provided on a surface of said silicon semiconductor layer, wherein a carrier flows through a (311) plane located along said gate insulating film in said silicon semiconductor layer.

23. The device of claim 22 wherein said carrier is an electron or a hole.

* * * * *